US006492280B1

(12) United States Patent
DeOrnellas et al.

(10) Patent No.: US 6,492,280 B1
(45) Date of Patent: Dec. 10, 2002

(54) METHOD AND APPARATUS FOR ETCHING A SEMICONDUCTOR WAFER WITH FEATURES HAVING VERTICAL SIDEWALLS

(75) Inventors: Stephen P. DeOrnellas, Santa Rosa, CA (US); Alferd Cofer, Petaluma, CA (US); Paritosh Rajora, Petaluma, CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

(21) Appl. No.: 09/517,387

(22) Filed: Mar. 2, 2000

Related U.S. Application Data

(63) Continuation of application No. 08/742,861, filed on Nov. 1, 1996, now Pat. No. 6,127,277, which is a continuation-in-part of application No. 08/675,559, filed on Jul. 3, 1996, and a continuation-in-part of application No. 08/675,093, filed on Jul. 3, 1996, now Pat. No. 6,048,435.

(51) Int. Cl.[7] .............................................. H01L 21/302
(52) U.S. Cl. ..................... 438/714; 438/711; 438/720; 438/729; 438/734; 134/1.2; 216/71
(58) Field of Search ................................ 438/714, 711, 438/720, 729, 734; 134/1.2; 216/71

(56) References Cited

U.S. PATENT DOCUMENTS

| | | |
|---|---|---|
| 2,468,174 A | 4/1949 | Cotton |
| 3,458,817 A | 7/1969 | Cooper et al. |
| 4,233,109 A | 11/1980 | Nishizawa |
| 4,263,088 A | 4/1981 | Gorin |
| 4,349,409 A | 9/1982 | Shibayama et al. |
| 4,352,725 A | 10/1982 | Tsukada |
| 4,399,016 A | 8/1983 | Tsukada et al. |
| 4,464,223 A | 8/1984 | Gorin |
| 4,579,618 A | 4/1986 | Celestino et al. |
| 4,585,516 A | 4/1986 | Corn et al. |
| 4,889,588 A | 12/1989 | Fior |
| 4,902,377 A | 2/1990 | Berglund et al. |
| 5,492,855 A | 2/1996 | Matsumoto et al. |
| 5,498,768 A | 3/1996 | Nishitani et al. |
| 5,512,130 A | * 4/1996 | Barna et al. ............. 156/643.1 |
| 5,565,036 A | 10/1996 | Westendorp et al. |
| 6,110,287 A | * 8/2000 | Arai et al. .................. 156/345 |
| 6,127,277 A | * 10/2000 | DeOrnellas et al. ........ 438/714 |

FOREIGN PATENT DOCUMENTS

| | | |
|---|---|---|
| EP | 0026604 A1 | 8/1981 |
| JP | 52-127168 | 10/1977 |
| JP | 59-16334 | 1/1984 |
| JP | 04-023323 | * 1/1992 |
| JP | 04-184926 | * 7/1992 |
| JP | 04-323823 | * 11/1992 |
| JP | 05-182929 | * 7/1993 |

OTHER PUBLICATIONS

V.J. Minkiewicz and B.N. Chapman, *Triode plasma etching*, Appl.Phys.Lett.34(3); Feb. 1979, p. 192–193.
B.N. Chapman, *Triode Systems for Plasma Etching*, IBM Technical Disclosure Bulletin, vol.21, No. 12, May 1979, IBM Corp. 1979; pp. 5006–5007.
Brochure: The First Low–Pressure High Density Single–Wafer Etch Technology Has a New Name . . . HRe⁻, High Density Reflected Electron, Tegal Corporation, 1993.
Y. Nishioka, et al., Giga–bit scale dram cell with new simple Ru/(Ba,Sr)Ti)$_3$/Ru stacked Capacitors using x–ray lithography, IEDM Tech. Digest, pp. 903–906, 1995.
A. Yuuki, et al., Novel stacked capacitor technology for 1 Gbit drams with CVD–(Ba,Sr)Ti)$_3$ thin films on a thick storage node of Ru, IEDM Tech. Digest, pp. 115–118, 1995.
W.J. Yoo, et al., Control of the pattern slope in $Ar/Cl_2$/O2 plasmas during etching of Pt, 1995 Dry Process Symposium, The Institute of Electrical Engineers of Japan, pp. 191–194 (1995).

* cited by examiner

Primary Examiner—George Goudreau
(74) Attorney, Agent, or Firm—Fliesler, Dubb, Meyer & Lovejoy LLP (57) ABSTRACT

A method and apparatus provide for etching a semiconductor wafer using a two step physical etching and a chemical etching process in order to create vertical sidewalls required for high density DRAMs and FRAMs.

41 Claims, 10 Drawing Sheets

METHOD AND APPARATUS FOR ETCHING A SEMICONDUCTOR WAFER WITH FEATURES HAVING VERTICAL SIDEWALLS

This application is a continuation of Ser. No. 08/742,861 now U.S. Pat. No. 6,127,277 filed Nov. 1, 1996, which is a continuation-in-part of Ser. No. 08/675,559 filed Jul. 3, 1996, now pending, and Ser. No. 08/675,093 filed Jul. 3, 1996, now U.S. Pat. No. 6,048,435.

CROSS-REFERENCE

The following U.S. patent applications, all owned by Tegal Corporation, are cross-referenced and hereby incorporated by reference:
1. Title: INTEGRATED SEMICONDUCTOR WAFER PROCESSING SYSTEM
   Inventor: Stephen P. DeOrnellas
   U.S. Pat. No. 5,672,239
   Filed: May 10, 1995
2. Title: PLASMA ETCH REACTOR AND METHOD
   Inventor: Stephen P. DeOrnellas
      Leslie G. Jerde
      Alferd Cofer
      Robert C. Vail
      Kurt A. Olson
   Ser. No.: 08/675,559
   Filed: Jul. 3, 1996
3. Title: PLASMA ETCH REACTOR AND METHOD FOR EMERGING FILMS
   Inventor: Stephen P. DeOrnellas
      Alferd Cofer
      Robert C. Vail
   U.S. Pat. No. 5,837,217
   Filed: Jul. 3, 1996

FIELD OF THE INVENTION

The present invention is directed to an improved plasma etch reactor apparatus and method.

BACKGROUND OF THE INVENTION

A new set of emerging films are being beneficially employed in the development of high density semiconductor chips such as for example high density dynamic random access memories ("DRAM") and ferroelectric random access memories ("FRAM"). These materials provide for higher capacity devices by allowing for a reduction in the size of the individual features on the memory substrate. Accordingly, enhanced profile control technologies are required.

In the past, a number of techniques have been used to obtain a desired semiconductor feature wall profile. One technique is ion milling which is classified as a physical etching method. With this technique, an ion mill beam is used to physically sputter away portions of a layer of a semiconductor device which are not desired, leaving the desired feature defining the various components and traces on the semiconductor device. While such techniques have produced desirable profiles, the disadvantage of using ion milling techniques is that the processes are slower and such techniques tend to cause the formation of veils or fences upstanding from the desired feature.

Photoresist material is to protect and define the desired features produced by the ion milling technique. Once the photoresist material is stripped away, the veils or fences remain as undesirable and difficult to remove structures.

Chemical etching is another technique employed to remove portions of a layer of a semiconductor wafer which are unprotected by photoresist material. Such methods, while providing for faster etching than provided by, for example, ion milling, do not necessary have the same profile control afforded by ion milling.

Accordingly, there is a need to provide an etching process and apparatus which quickly and accurately processes emerging films which are used in the latest semiconductor products.

SUMMARY OF THE INVENTION

The present invention includes a method and apparatus designed to process emerging films which present unique etch problems. Such new films include for example, platinum and barium strontium titanate (BST), which are currently being used in the development of high density DRAM devices, and platinum and lead zirconium titanate (PZT) or bismuth strontium tantalate (Y-1), which are currently being used in development of non-volatile, FRAM devices. Of these new films, BST, PZT, and Y-1 have for example a high dielectric constant which allows for the development of greater circuit density, fine line geometry devices. With enhanced feature densities, more exacting vertical profile are required.

The present invention is directed to performing critical etching which results in anisotropic profiles (i.e., straight, vertical sidewalls) which is highly selective and causes minimal damage to the underlayer or other wafer materials, and which is performed uniformly over a non-uniform area.

Accordingly, the present invention provides for an apparatus and method which allows for a physical etching and then a chemical etching of a wafer in order to obtain wafer features with highly advantageous vertical sidewall profiles. The present invention provides for a method and apparatus which operates on a continuum, first emphasizing physical etching such as for example, by way of ion milling, and then emphasizing chemical etching.

Such a technique is uniquely counter-intuitive in that the ion milling portion of the process creates the desired vertical profiles, but in addition creates undesirable veils. However, advantageously, the present invention provides for a chemical etching in a continuum with the operation, which chemical etching satisfactory removes the veils. Accordingly thereafter, such that the semiconductor wafer can be operated on with other methods such as the unique rinse-strip-rinse method presented in the above U.S. patent application Ser. No. 08/438,261, now U.S. Pat. No. 5,672,239, to obtain the desired feature, configuration, densities and profiles. Thus, after the chemical etching process has occurred, the wafer is rinsed in order to remove any soluble residue prior to the stripping away of the photoresist material in a stripping or ashing step and with a subsequent post-strip rinsing of the semiconductor wafer to remove residue.

The method is performed in a chamber which has an electrode adjacent to where the semiconductor wafer is placed. The electrode is provided with a first power supply operated in the megahertz range and with a second power supply operated in the kilohertz range. During the first portion of the method, both power supplies are operable in order to enhance the ion milling technique. During the second portion of the method where the chemical etching is predominant, the second power supply operating in the kilohertz range is turned off, greatly reducing the influence of ion milling.

In another feature of the invention, a tri-electrode chamber is used wherein the bottom electrode is located adjacent the wafer and is powered as indicated above with two power supplies. A side peripheral electrode is either grounded or free-floating, and a top electrode spaced from and locked above the wafer is either grounded or allowed to be free-floating.

Other features, objects and advantageous of the invention can be obtained from a review of the specification, the claims, and the figures.

DETAILED DESCRIPTION OF THE PREFERRED EMBODIMENT

As indicated above, improved profiles are important with the new emerging high density DRAMs and FRAMs which have fine line geometry with dense feature topography. The density of the features can be measured by the pitch, where the pitch is defined as sum of the width of the feature and the width of the space between features. Typically, high density features have a pitch which is about and less than 2.0 microns and preferably about and less than 0.5 microns. Features with such pitch are made possible using the present invention and also using high dielectric emerging films, such as lead zirconium titanate (PZT), barium strontium titanate (BST), and bismuth strontium tantalate (Y–1), which dielectric films have dielectric constants in the above 200 range, and typically between 200 and 1,400.

Such high density, emerging semiconductor structures employ material such as platinum (Pt), iridium (Ir), iridium dioxide ($IrO_2$), lead zirconium titanate (PZT), ruthenium (Ru), ruthenium dioxide ($RuO_2$), barium strontium titanate (BST), bismuth strontium tantalate (Y–1), and other emerging films. For a high density feature the electrodes can be comprised of, for example, platinum with PZT (having a dielectric constant of about 1,400) or BST or Y–1 deposited therebetween in order to establish the high capacitive value required. To take maximum advantage of the ability to create such high capacitive features in a smaller space, it is important that the features have a profile in the range of 70° to 85° and preferably as close to normal as possible, and that there be no residues on the sidewalls.

Figure 1:
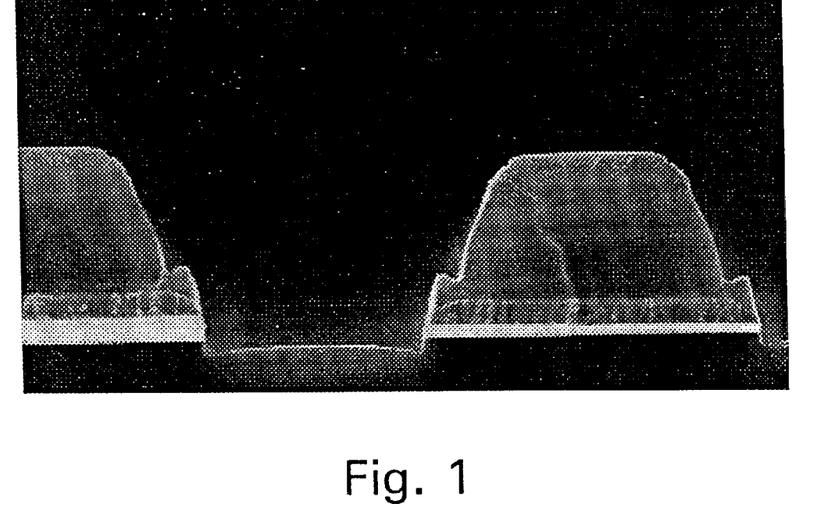
FIG. 1 is a micrograph of a semiconductor wafer feature using an ion milling technique showing the veils or fences and with the photoresist in place.
Figure 2:
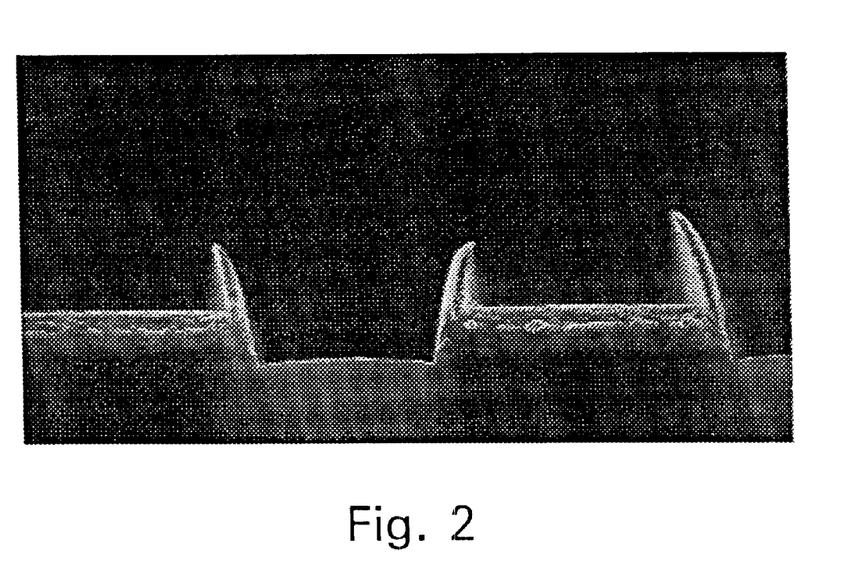
FIG. 2 is a micrograph of another semiconductor feature showing in greater detail the veils or fences remaining after an ion milling process and with the photoresist material removed.
Figure 3:
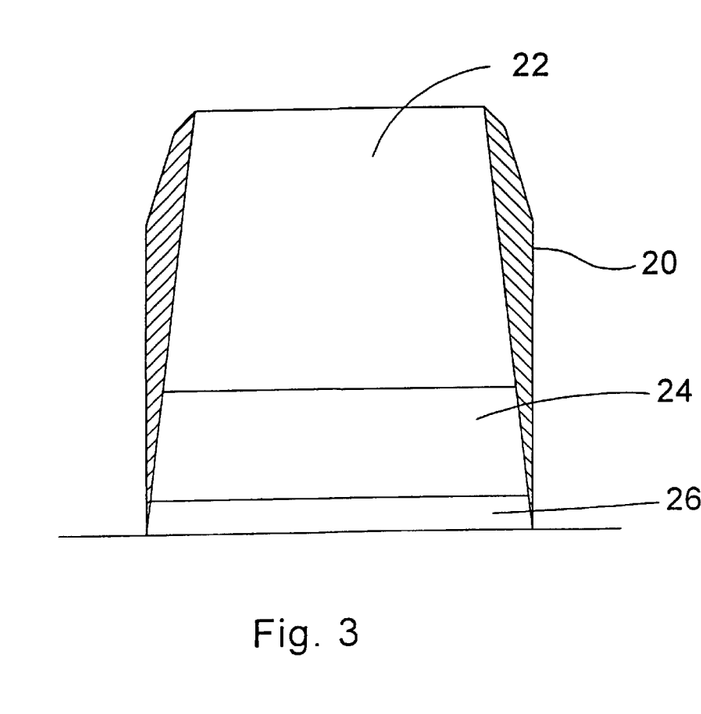
FIG. 3 is a schematical representation of a feature such as found in FIG. 2 with the photoresist still in place.

With respect to FIGS. 1, 2 and 3, micrographs and a schematic of a feature of a semiconductor wafer demonstrating vertical sidewalls with sidewall veils or fences extending upwardly therefrom are depicted. These veils 20 (FIG. 3) are caused by an ion milling process where sputtering dominates the etching process. Materials sputter from the areas unprotected by the photoresist 22 deposit as said veils 20. As can be seen in FIG. 3, these veils 20 tend to coat the photoresist material 22. When the photoresist material is stripped away, the veils remain as shown in FIG. 2. These veils are comprised of platinum from the platinum layer 24 which as shown in FIG. 3 has been deposited on the layer of titanium 26. These veils are redeposits of sputtered platinum and can include other materials such as silicon dioxide, carbon, halogens, and other materials involved in the etching process. These veils can also include materials from other films and layers which are contained in the semiconductor wafer, such as by way of example only, Ir, $IrO_2$, PZT, Ru, $RuO_2$, BST, and Y–1. It is to be understood that veils caused by ion milling are more prevalent for small pitch patterns, where the pitch is less than 0.5 microns, and thus the above process is most beneficial for the emerging high density DRAM and FRAM devices. The advantage of this operation is the fact that the sidewalls produced are vertical in the 70° to 85° range and higher.

Figure 4:
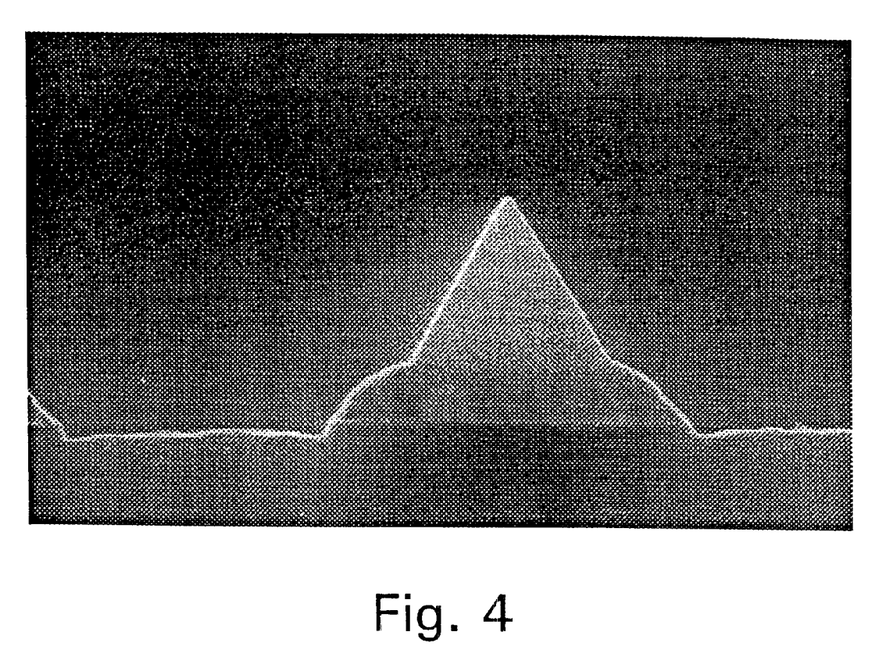
FIG. 4 is a micrograph of a semiconductor feature including the photoresist after a typical chemical etching operation.
Figure 5:
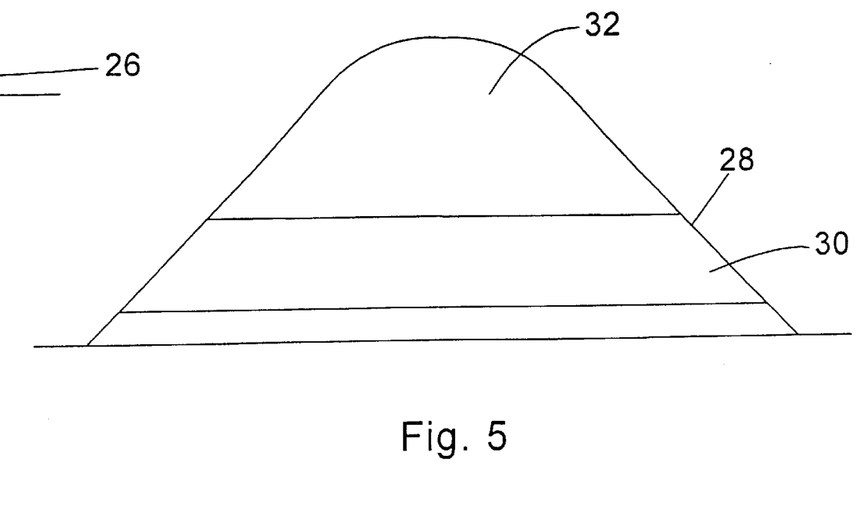
FIG. 5 is a schematical representation of a feature such as found in FIG. 4 with the photoresist still in place.

FIGS. 4 and 5 depict the profile of a semiconductor feature produced through a chemical etch process. As can be seen in FIG. 5 the sidewall 28 of the platinum feature 30 has a poor profile, not suitable for dense patterns required for the above referenced advanced semiconductor devices. Chemical etching giving a sidewall profile of 40° to 50°. In both FIGS. 4 and 5, the photoresist material 32 is positioned atop the platinum layer 30, which layer has not been stripped away.

Figure 6:
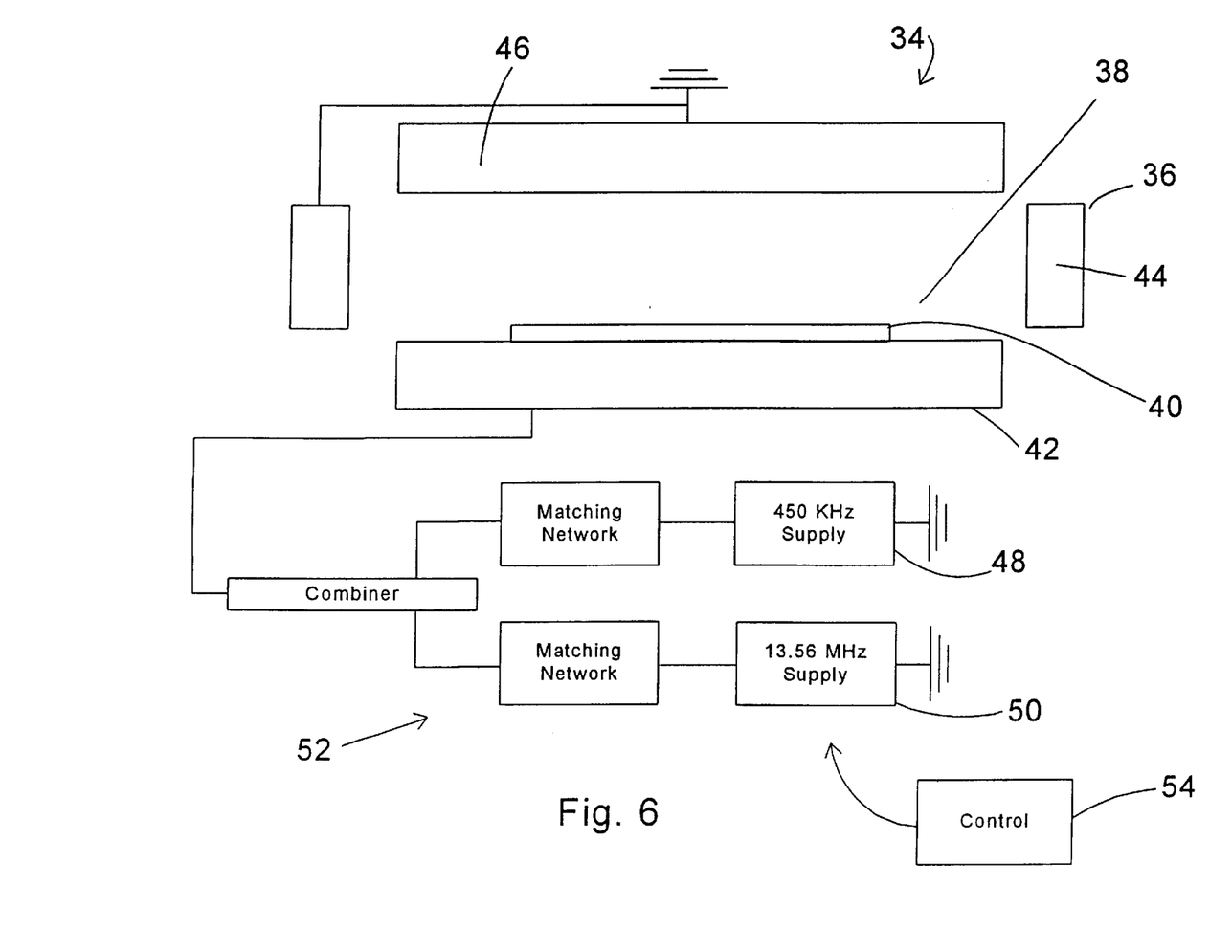
FIG. 6 is a schematical representation of an embodiment of the etching apparatus of the invention.
Figure 10:
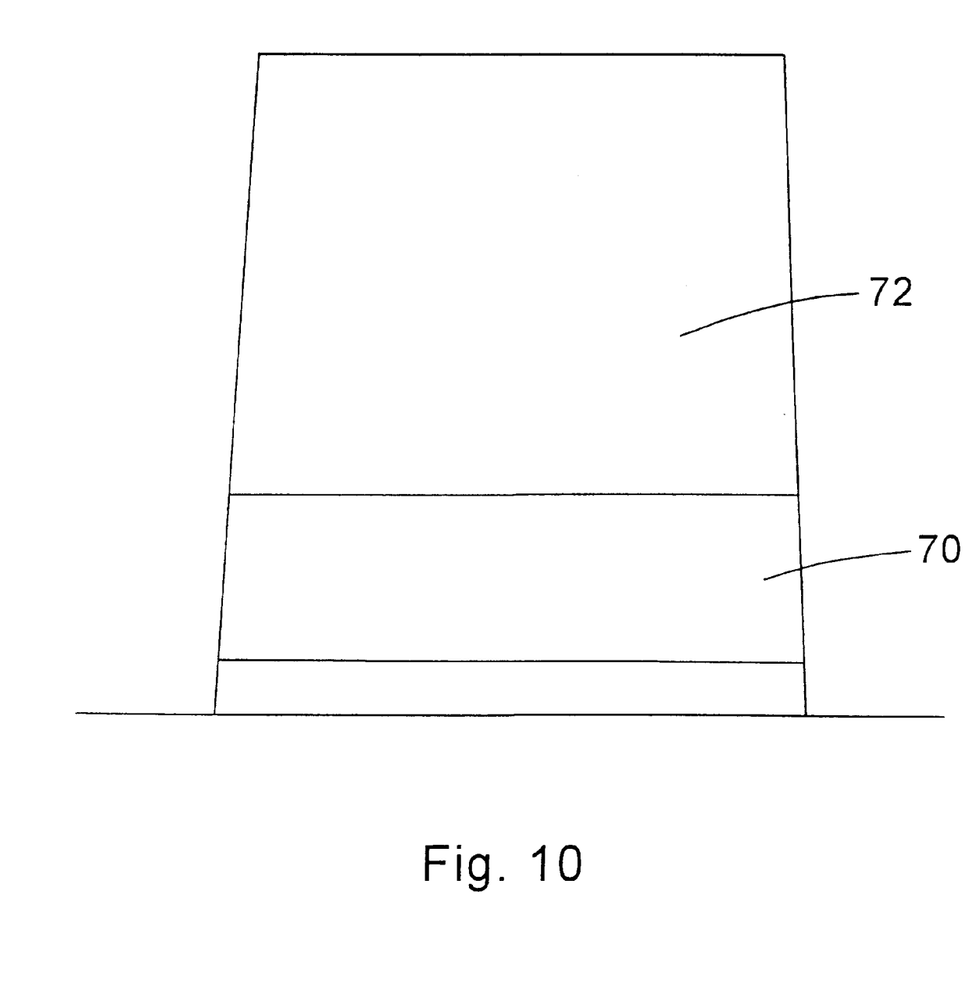
FIG. 10 is a schematical representation of the semiconductor feature shown in FIG. 7 with the photoresist material still in place.

The present invention provides for a continuous etching operation using the benefits of both physical etching (ion milling) and chemical etching in order to produce a semiconductor feature having a profile such as shown in FIG. 10. The present invention includes an etching apparatus (tri-electrode reactor) 34 as seen in FIG. 6. The etching apparatus 34 includes a housing 36 and an etching chamber 38. A wafer 40 is positioned on a bottom electrode 42. The chamber 38 further includes side peripheral electrode 44 and an upper electrode 46. In a preferred embodiment, the side peripheral electrode 44 can be grounded or allowed to establish a floating potential as a result of the plasma developed in the chamber 38. The upper electrode 46 is generally grounded. In typical operation, both the side peripheral electrode 44 and the upper electrode 46 are grounded as shown in FIG. 6.

Figure 12:
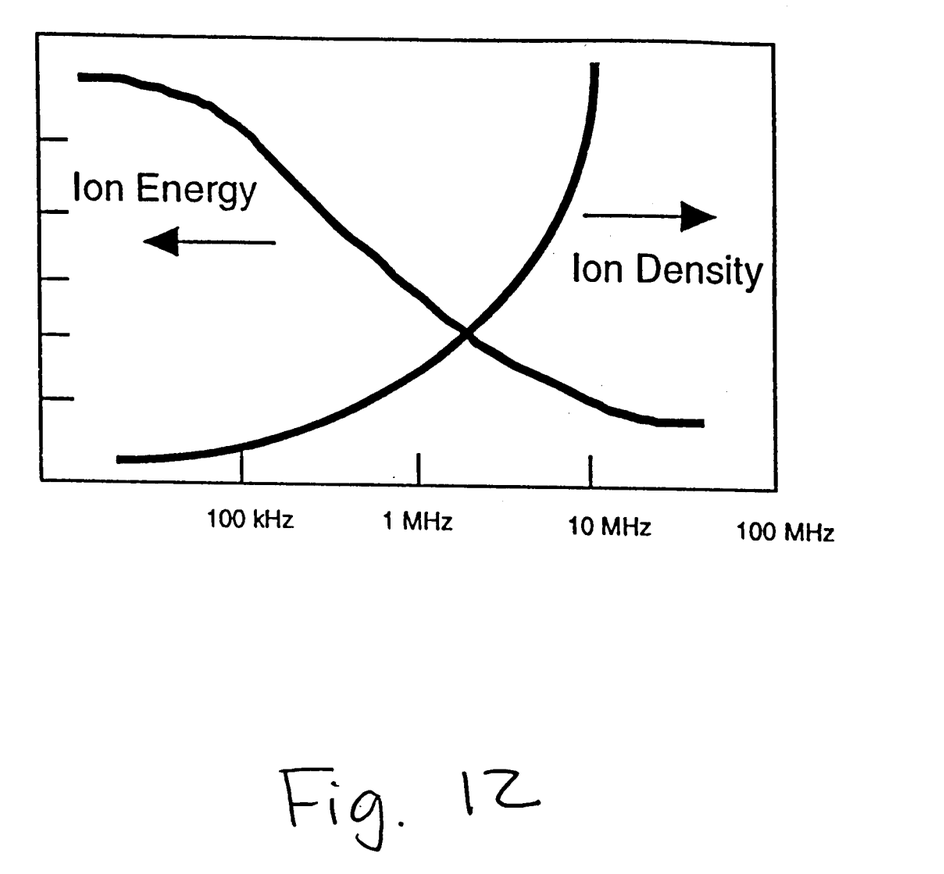
FIG. 12 is a graph showing ion energy and ion density compared to RF frequency at which the power supply is provided.

Preferably two power supplies, first power supply 48 and second power supply 50, are connected to the bottom electrode 42 through a appropriate circuitry 52 which includes matching networks and a combiner. Further a controller 54 controls the sequencing of the first and second AC power supplies 48, 50. Typically, the first power supply operated in the kilohertz range and is optimally provided at about 450 KHz, and typically in the range of less than 500 KHz. The second power supply operates in the megahertz range, and typically operates at about 13.56 MHZ, although other frequencies above about 1 MHZ and also multiples of 13.56 MHZ can be used with the present invention. As can be seen in FIG. 12, ion energy increases towards the kilohertz range while ion density increases towards the megahertz range. This characteristic is important in the operation of the present invention as described below.

Figure 7:
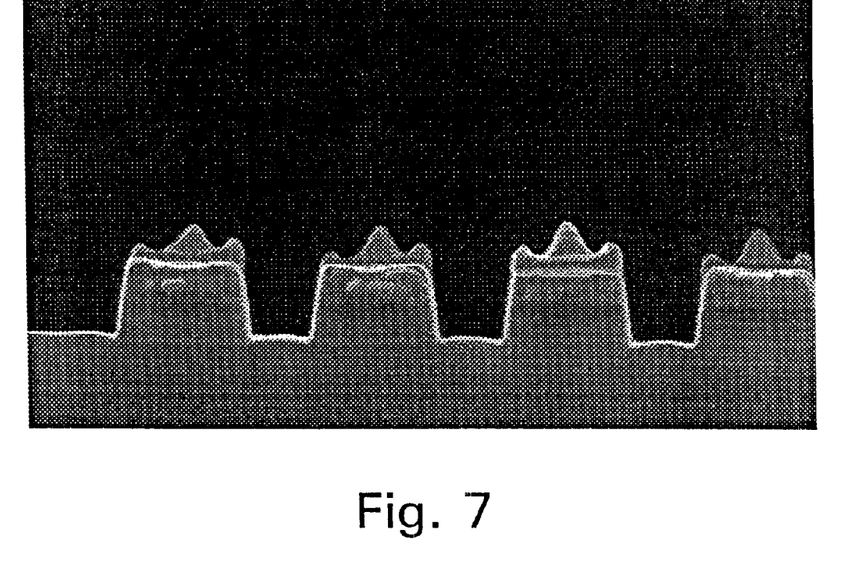
FIG. 7 is a micrograph of a feature of a semiconductor chip after the inventive physical and chemical etching steps of the invention have been performed.
Figure 8:
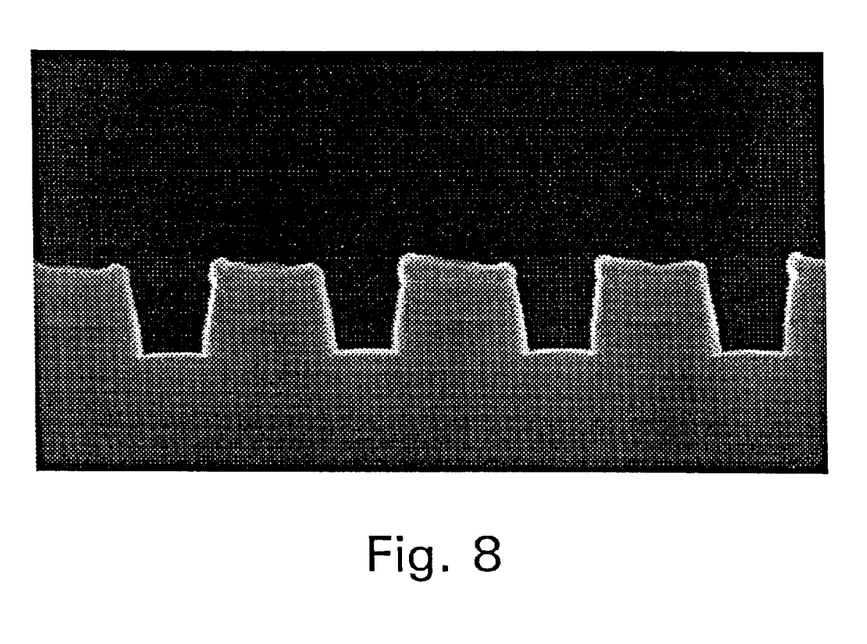
FIG. 8 is a micrograph of the feature of FIG. 7 after an ashing or stripping step has been performed in order to remove photoresist material and residues.
Figure 9:
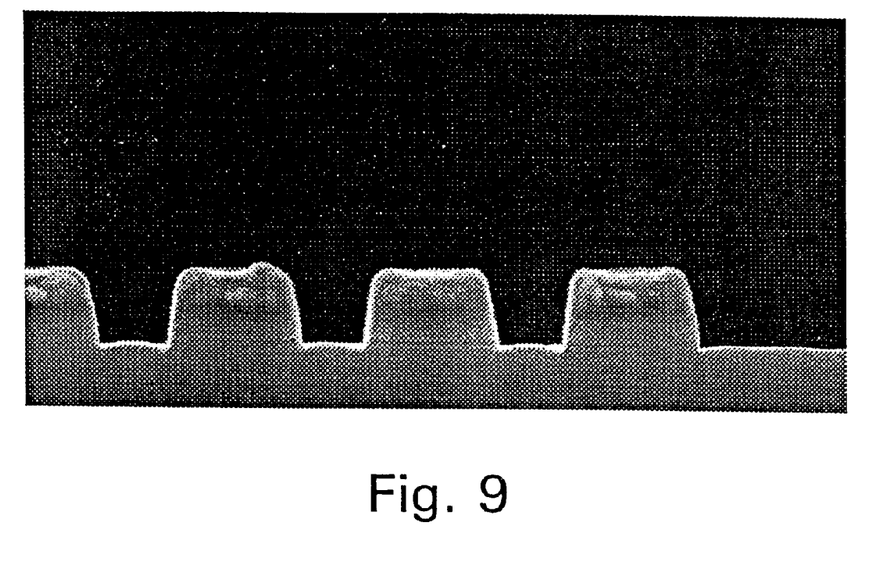
FIG. 9 is a micrograph of the semiconductor feature of FIG. 8 after a rinse step has been performed in order to define the final desired feature with appropriate vertical profiles.

As indicated above, the present invention provides for a continuum of etching starting from predominantly physical etching (ion milling) and continuing to predominantly chemical etching. Such a procedure is quite naturally counter-intuitive as the first portion of the process requires physical etching, which physical etching has historically resulted in sidewall veils as shown in FIG. 3. Once the first step of physical etching is complete as measured by the process being within a certain range of or at end point, the process is converted to the second step of chemical etch through the introduction of a different gas regime with a different power input. The second step is effective in etching away the veils while maintaining the sidewall profile so that a semiconductor feature such as shown in FIGS. 7 and 10 is established. In FIG. 10, the platinum layer 70 has substantially vertical sidewalls, and the platinum layer 70 and the photoresist layer 72 has substantially no veils associated therewith. Preferably, subsequent to the chemical etch operation, the semiconductor wafer is rinsed prior to a photoresist stripping operation so that water soluble compounds such as water soluble chlorides can be washed away prior to the photoresist stripping or ash operation. After the photoresist stripping operation, a post strip solvent rinse operation is performed. These steps are depicted in FIGS. 7, 8 and 9 and will be discussed hereinbelow. These steps are also discussed in the above-referenced patent application entitled INTEGRATED SEMICONDUCTOR WAFER PROCESSING SYSTEM which is directed to a proprietary rinse-strip-rinse operation and which is incorporated herein by reference.

It must be understood that in the preferred operation, during the first of physical etching, that chemical etching does occur, and also during the second step which is predominantly chemical etching that physical etching or ion milling also occurs.

By way of example, in a procedure for the inventive method, ion milling would be accomplished using argon and chemical etching would be accomplished using chlorine. In the first preferred method during the physical etching (ion milling) stage, argon would be supplied to the chamber 38 (FIG. 6) at about approximately 10 SCCM (standard cubic centimeter per minute) to about 50 SCCM and preferably at about 20 SCCM, and the chlorine would be supplied to the chamber at from about 2 SCCM to about 50 SCCM and preferably in the range of about 5 SCCM to about 10 SCCM. The pressure in the chamber during physical etch would be maintained at approximately 2 to 10 millitorr and preferably at about 5 millitorr with the temperature at approximately 80° C. Preferably the first power supply 48 would be operated at about 450 KHz in the power range of about 50 watts to about 200 watts. The second power supply 50 would be operated at about 13.56 MHZ in the power range of about 500 watts to about 1100 watts. Typically, the physical etching operation would run with a time period of about two-thirds to 100% of end point. The optical end point for a platinum structure where the platinum is 1000 angstroms thick would be approximately 70 seconds for a wafer in the 6" to 8" range. Optical end point for such a structure where the platinum is 2000 angstroms thick would be approximately 150 seconds for a wafer in the 6" to 8" range. When end point is used as a time measure, a trial physical etch process is run until end point is reached. Thereafter, production runs are made based on a fraction of the end point time determined in the trial run. Alternatively, the timing for the physical etch operation can be obtained without determining end point. For example, the time period required to etch through a film can be determined and then a fraction of that time period, from by way of example only, about two-third to about one hundred percent of that time period, can be used for the physical etch step.

Once end point or a percentage of end point has been reached, the process shifts to predominantly chemical etching. In this situation, the argon is preferably maintained at about 20 SCCM and the chlorine flow rates increased preferably to about 15 SCCM. For chemical etch, however, the argon gas can have a flow rate of about zero SCCM to about 50 SCCM and the chlorine gas can have a flow rate of about 5 SCCM to about 100 SCCM.

Figure 11:
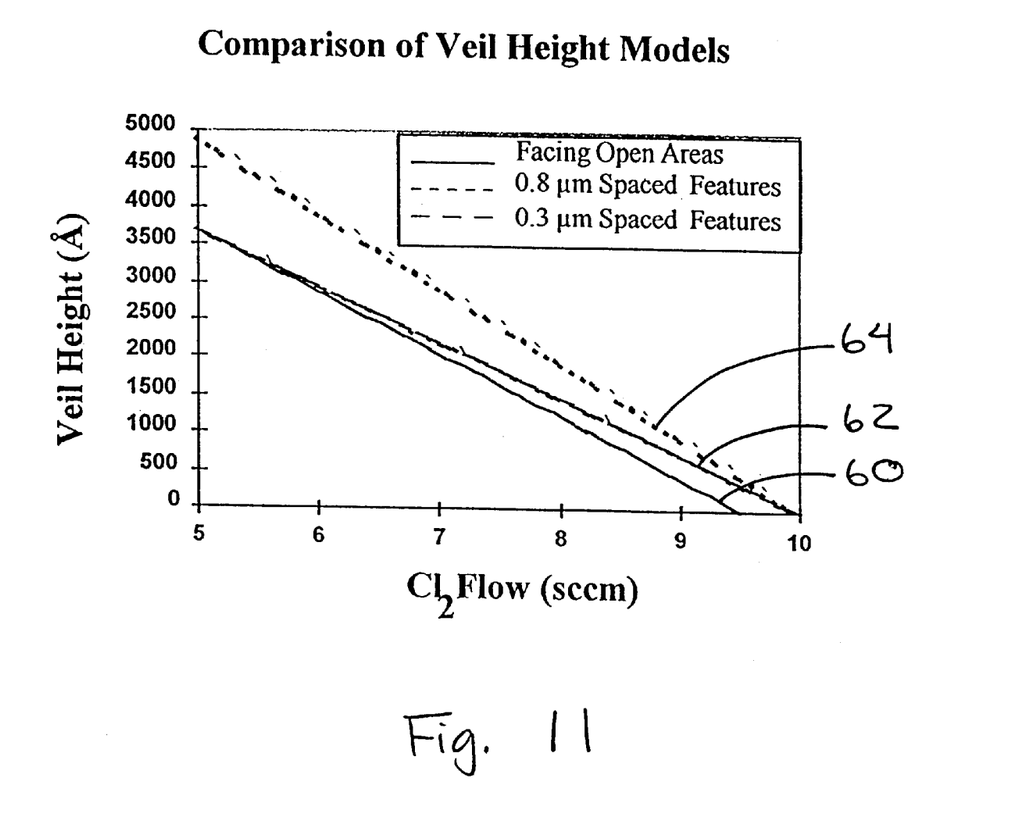
FIG. 11 is a representative graph depicting the veil height remaining in comparison to a chlorine flow rate for the chemical etching process.

FIG. 11 shows a graph comparing final veil height in angstroms to chlorine flow rates in SCCMs. As the flow rate for the chlorine increases, the veil height decreases and as can be seen with the flow rate at or above about 10 SCCM, the veil is substantially attacked and reduced in size. In the graph of FIG. 11 the line identified by 60 is for veils which are facing an open area. The line 62 is for veils with the features spaced at approximately 0.8 microns. Line 64 represents veils with features spaced at approximately 0.3 microns.

During the chemical etching operation, the pressure is reduced to approximately 2 millitorr to about 10 millitorr and preferably about 2 millitorr. The first power supply 48 in the kilohertz range is preferably turned off in order to significantly reduce the ion milling effect. In practice during chemical etch, the first power supply can operate in the range of about 0 watts to about 50 watts. As seen in FIG. 12, it is the kilohertz range power supply which drives ion milling operation by increasing the ion energy. The second power supply 30 is maintained at about 13.56 MHZ, with a power of about 500 watts to about 1100 watts.

In a preferred embodiment, for the second chemical etching phase of this two step operation, the chemical etch process is operated for a platinum thickness of both 1000 angstroms and 2000 angstroms for about 45 seconds to about 120 seconds in order to substantially remove the veils created through the ion milling process.

For etching of metals or conductors, chemistries including (1) argon and chlorine, (2) argon, chlorine and hydrogen bromide (HBr), or (3) argon, chlorine and carbonyl gases, (4) any of the above chemistries with oxygen ($O_2$), (5) $SF_6$ by itself or with any of the above chemistries, (6) $NF_3$ by itself or with any of the above chemistries, and (7) a fluorocarbon (CxFy) by itself or with other chemistries, are preferred. For etching oxides or dielectrics, chemistries can include combinations such as (1) argon and $CF_4$, (2) argon, $CF_4$, and chlorine, (3) argon, $CHF_3$, and chlorine, (4) any of the above combined with hydrogen bromide (HBr), (5) $SF_6$ by itself or with any of the above chemistries, (6) $NF_3$ by itself or with any of the above chemistries, (7) a fluorocarbon (CxFy) by itself or with other chemistries, and (8) argon and chlorine gases.

The results of the above two step process, both the physical etching and the chemical etching, are seen in micrograph of FIG. 7 where the photoresist is identified by the central peak of each feature and some remnants of the veils are shown on each side thereof. At this stage, the semiconductor feature is rinsed in order to remove any soluble compounds. After rinsing, the semiconductor wafer is exposed to a stripping or ashing process in order to remove the photoresist and residue associated with the veils (FIG. 8). The stripping operation is performed preferably with a wet solvent. The solvent attacks both the remaining veils and the photoresist. After the stripping operation, the semiconductor wafer is exposed to a subsequent rinsing operation resulting in the feature as indicated in FIG. 9.

Figure 13:
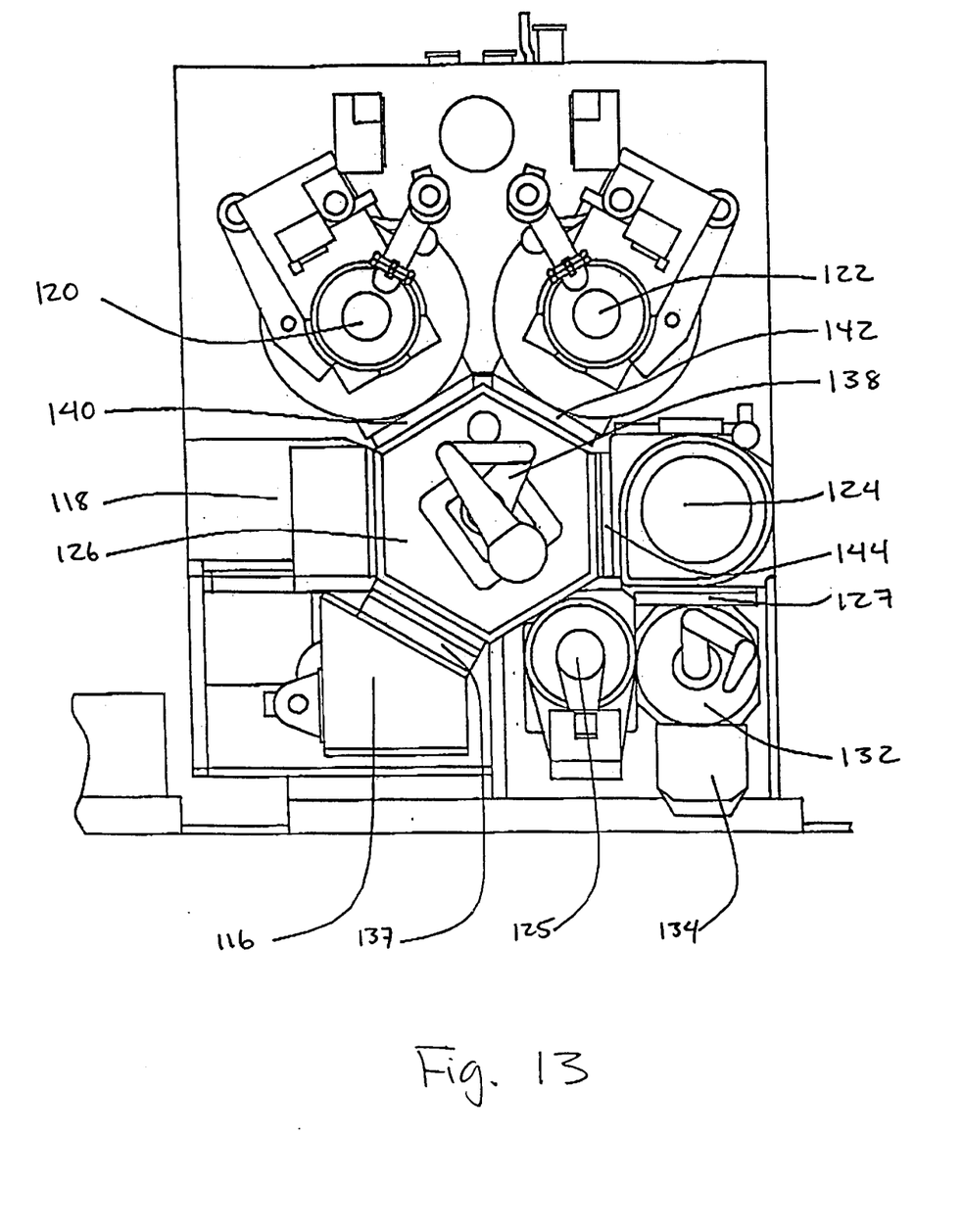
FIG. 13 is a top plan view of a wafer processing apparatus.

The rinse-strip-rinse operation, as indicated above, can be carried out by way of example by the apparatus as shown in FIG. 13. The system of FIG. 13 includes a vacuum load lock chamber 116, an alignment module 118, two etch modules 120 and 122, and a strip module 124, all of which are connected to a central vacuum chamber 126 through a closable opening and are operated by a computer process control system (not shown). Load lock chamber 116 houses an internal cassette elevator for holding a wafer cassette (entry cassette). Vacuum chamber 126 has a robotic wafer handling system 138 for transferring wafers from one chamber or module to another. Strip module 124 is connected to an atmospheric robotic wafer handling system 132 through a closable opening 127, which in turn is connected to rinse module 125 and atmospheric cassette module 134 (exit cassette). An example of a typical rinse module used is the Semitool Equinox rinse system. Atmospheric robotic wafer handling system 132 services the atmospheric cassette module 134 which holds wafers after the completion of processing. In addition, the second robotic wafer handling system. 132 transfers wafers between strip module 124 and rinse module 125. During the rinsing process, rinse module 125 and robotic handling system 132 are designed to maintain the degree of wafer alignment required by strip module 124 for stripping. The operation of the present invention is automated and programmable through a computing system.

In operation, after being etched in one of the etching modules 120, 122, the wafer is transported through the strip module 124 to the rinse module 125 by the robotic arm 132 where the first rinse occurs. After this rinse, the robotic arm 132 transfers the wafer back to the strip module 124 where photoresist stripping occurs. After stripping, the wafer is then transported by the robotic arm 32 back to the rinse module 25 for final rinsing.

It is to be understood that the present invention can also be used with hard masks (oxides and the like) as well as with composite structures with photoresist. The invention additionally can be used with a wide range of films in addition to the emerging films specified herein.

It is also to be appreciated that reactors other than that specified above can be used with the method. By way of example only, the present invention can be used with inductively coupled plasma source reactors (ICP). Inductively coupled plasma sources can include by way of example only helicon reactors and helical reactors. The above tri-electrode reactor is a capacitively coupled reactor. Further, the present method can be used in a reactor that is both inductively coupled and capacitively coupled. Other reactors such as ECRs, electron cyclotron resonance reactors can be used with the present invention.

INDUSTRIAL APPLICABILITY

From the above, it can be seen that the present inventive apparatus and method provides an etching operation including first a physical etching step and then a second chemical etching step in order to accomplish the desired vertical profiles for density patterns on semiconductor wafers required by the emerging DRAMs and FRAMs. This inventive apparatus and method allows the vertical walls to be established and then the veils to be removed. The apparatus and method are capable of handling the new emerging films required for the newest high density semiconductor products.

Other features, aspects and objects of the invention can be obtained from a review of the figures and the claims.

It is to be understood that other embodiments of the invention can be developed and fall within the spirit and scope of the invention and claims.

We claim:

1. A method of etching a wafer comprising the steps of:
   physically etching and then chemically etching a wafer in order to obtain wafer features with at least substantially vertical side wall profiles; and
   wherein there is an electrode which is provided with a first power supply in the kilohertz range and with a second power supply in the megahertz range during physical etching and is provided with a power supply in the megahertz range during the entire process of chemical etching.

2. The method of claim 1 including the step of:
   wherein said steps of physically etching and then chemically etching provide for substantially vertical side wall profiles with less residue.

3. The method of claim 1 wherein the step of physically etching the wafer uses argon gas at about 10 SCCM to about 50 SCCM and chlorine gas at about 2 SCCM to about 50 SCCM.

4. The method of claim 1 wherein the step of physically etching the wafer occurs at about 2 millitorr to about 10 millitorr.

5. The method of claim 1 wherein said step of physical etching occurs in a chamber with the wafer positioned adjacent to an electrode which is provided with power at about 450 KHz and with power at about 13.56 MHZ.

6. The method of claim 1 wherein said step of physical etching occurs in a chamber with the wafer positioned adjacent to an electrode, which electrode is provided with a first power source at about or less than 500 KHz and with a second power source at about one MHZ or greater.

7. The method of claim 1, wherein said step of physical etching occurs in a chamber with the wafer positioned on the electrode.

8. The method of claim 7 wherein said first power source provides power in the range of about 50 watts to about 200 watts and said second power source provides power in the range of about 500 watts to about 1100 watts.

9. The method of claim 7 wherein said electrode is a bottom electrode and said method is performed in a chamber which also has a side peripheral electrode located adjacent to an edge of the bottom electrode and an upper electrode that is above and spaced from the bottom electrode and wherein said side peripheral electrode is one of electrically grounded or electrically floating, and said upper electrode is one of electrically grounded or electrically floating.

10. The method of claim 1 wherein said physical etching step is performed at about 80° C.

11. The method of claim 1 wherein said physical etching step is performed from between about two-thirds of the endpoint detection time and about endpoint detection time.

12. The method of claim 3 wherein the step of chemical etching the wafer uses argon gas at about zero SCCM to about 50 SCCM and chlorine gas in the range of about 5 SCCM to about 100 SCCM.

13. The method of claim 4 wherein the step of chemically etching the wafer occurs at about 2 millitorr to about 10 millitorr.

14. The method of claim 7 wherein the step of chemical etching occurs with the electrode provided with power from the first power source operated in the kilohertz range and from the second power source operated in the megahertz range, wherein the first power source provides power in the range of from about no power to about 50 watts.

15. The method of claim 14 wherein during the step of chemical etching the second power source provides power in the range of about 500 watts to about 1100 watts.

16. The method of claim 7 wherein during the step of chemical etching the first power supply operated in the kilohertz range is turned off in order to reduce the effects from physical etching.

17. The method of claim 1 wherein, for a layer of platinum at about 1000 angstroms thick,
the physical etching step takes about 70 seconds; and
the chemical etching step takes from about 60 seconds to about 120 seconds.

18. The method of claim 1 wherein for metal layers the physical etching and the chemical etching use one of:
argon and chlorine gases;
argon, chlorine, and hydrogen bromide gases;
argon, chlorine, and carbonyl gases;
any of the above with oxygen;
$SF_6$ by itself or with any of the above;
$NF_3$ by itself or with any of the above; and
a fluorocarbon by itself or with other chemistries.

19. The method of claim 1 wherein for dielectric layers the physical etching and the chemical etching use one of:
argon and $CF_4$ gases,
argon, $CF_4$ and chlorine gases,
argon, $CHF_3$ and chlorine gases,
any of the above combination with hydrogen bromide gases,
$SF_6$ by itself or with any of the above,
$NF_3$ by itself or with any of the above,
a fluorocarbon by itself or with other chemistries, and
argon and chlorine gases.

20. A method of etching a wafer comprising the steps of:
performing a combined physical etch and chemical etch of a wafer with the step being principally a physical etch step;
subsequently performing a combined physical etch and chemical etch of the wafer with the subsequent step being principally a chemical etch step; and
wherein there is an electrode which is provided with a first power supply in the kilohertz range and with a second power supply in the megahertz range during physical etching and is provided with a power supply in the megahertz range during the entire process of chemical etching.

21. The method of claim 1 performed on a semiconductor wafer with features having a pitch of about or less than 2.0 microns.

22. The method of claim 1 performed on fine line geometry semiconductor devices having a pitch of about or less than 2.0 microns and preferably less than 0.5 microns.

23. The method of claim 3 wherein the step of physically etching the wafer uses argon gas at preferably about 20 SCCM and chlorine gas at about 5 SCCM to about 10 SCCM.

24. The method of claim 4 wherein the step of physically etching the wafer occurs preferably at about 5 millitorr.

25. The method of claim 8 wherein the first power source preferably provides power in the range of about 100 watts to about 200 watts and the second power source provides power in the range of about 500 watts to about 700 watts.

26. The method of claim 1 wherein the step of chemically etching the wafer uses argon gas at about zero SCCM to about 50 SCCM and chlorine gas in the range of about 5 SCCM to about 100 SCCM.

27. The method of claim 3 wherein the step of chemically etching the wafer preferably uses argon gas at about 20 SCCM and chlorine gas in the range of about 10 SCCM to about 15 SCCM.

28. The method of claim 26 wherein the step of chemically etching the wafer preferably uses argon gas at about 20 SCCM and chlorine gas in the range of about 10 SCCM to about 15 SCCM.

29. The method of claim 13 wherein the step of chemically etching the wafer occurs preferably at about 2 millitorr.

30. The method of claim 14 wherein the step of chemically etching occurs with the electrode provided with about no power from the first power source operated in the kilohertz range.

31. The method of claim 1 wherein the physical etching step is performed for a percentage of the time to reach process end point.

32. The method of claim 1 wherein the physical etching step is performed for a percentage of the time period required to etch through a film.

33. The method of claim 1 used in one of (1) an inductively coupled plasma source reactor, (2) an electron cyclotron resonance reactor, and (3) a tri-electrode reactor with high and low frequency power supplies coupled to one electrode.

34. The method of claim 1 used in a reactor that is both inductively coupled and capacitively coupled.

35. The method of claim 1 used in one of (1) an inductively coupled reactor and (2) a capacitively coupled reactor.

36. The method of claim 1 wherein the method is carried out in a tri-electrode chamber.

37. A method of etching a wafer comprising the steps of:
physically etching and then chemically etching a wafer in order to obtain wafer features with at least substantially vertical side wall profiles; and
wherein there is an electrode which is provided with power from a first power supply maintained in the kilohertz range and a second power supply maintained in the megahertz range during physical etching, and is provided with power from a power supply maintained in the megahertz range during chemical etching.

38. A method of etching a wafer comprising the steps of:
physically etching and then chemically etching a wafer in order to obtain wafer features with at least substantially vertical side wall profiles; and
wherein there is an electrode which is provided with power from a first power supply maintained in the kilohertz range and a second power supply maintained in the megahertz range during physical etching, and is provided with power from a power supply maintained in the megahertz range during the entire process of chemical etching.

39. A method of etching a wafer comprising the steps of:

performing a combined physical etch and chemical etch of a wafer with the step being principally a physical etch step;

subsequently performing a combined physical etch and chemical etch of the wafer with the subsequent step being principally a chemical etch step; and wherein there is an electrode which is provided with power from a first power supply maintained in the kilohertz range and a second power supply maintained in the megahertz range during physical etching, and is provided with power from a power supply maintained in the megahertz range during chemical etching.

40. A method of etching a wafer comprising the steps of:

performing a combined physical etch and chemical etch of a wafer with the step being principally a physical etch step;

subsequently performing a combined physical etch and chemical etch of the wafer with the subsequent step being principally a chemical etch step; and wherein there is an electrode which is provided with power from a first power supply maintained in the kilohertz range and a second power supply maintained in the megahertz range during physical etching, and is provided with power from a power supply maintained in the megahertz range during the entire process of chemical etching.

41. The method of claim 1 wherein, for a layer of platinum at about 2000 angstroms thick:

the physical etching step takes about 150 seconds; and the chemical etching step takes from about 60 seconds to about 120 seconds.

* * * * *